US010254340B2

United States Patent
DeForge et al.

(10) Patent No.: US 10,254,340 B2
(45) Date of Patent: Apr. 9, 2019

(54) INDEPENDENTLY DRIVING BUILT-IN SELF TEST CIRCUITRY OVER A RANGE OF OPERATING CONDITIONS

(71) Applicant: International Business Machines Corporation, Armonk, NY (US)

(72) Inventors: John B. DeForge, Barre, VT (US); Terence B. Hook, Jericho, VT (US); Theresa A. Newton, St. George, VT (US); Kirk D. Peterson, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 90 days.

(21) Appl. No.: 15/267,319

(22) Filed: Sep. 16, 2016

(65) Prior Publication Data

US 2018/0080986 A1   Mar. 22, 2018

(51) Int. Cl.
*G01R 31/317* (2006.01)
*G01R 31/28* (2006.01)
(Continued)

(52) U.S. Cl.
CPC ... *G01R 31/31724* (2013.01); *G01R 31/2831* (2013.01); *G01R 31/3177* (2013.01);
(Continued)

(58) Field of Classification Search
CPC ............ G01R 31/2815; G01R 31/2817; G01R 31/2831; G01R 31/317; G01R 31/31724;
(Continued)

(56) References Cited

U.S. PATENT DOCUMENTS 7,307,445 B2   12/2007 Liang et al.
2005/0093612 A1   5/2005 Gilliam
(Continued)

FOREIGN PATENT DOCUMENTS

WO   2010026089 A1   3/2010

OTHER PUBLICATIONS

Thomas, "Dynamic Single-P-Well SRAM bitcell characterization with Back-Bias Adjustment for Optimized Wide-Voltage-Range SRAM Operation in 28nm UTBB FD-SOI"; 2014 IEEE International Electron Devices Meeting (IEDM); 4 Pages; Date of Conference: Dec. 15-17, 2014, IEEE, Online Publication. ISBN: 978-1-4799-8001-7.

*Primary Examiner* — Christian M Dorman
(74) *Attorney, Agent, or Firm* — Cantor Colburn LLP; Vazken Alexanian

(57) ABSTRACT

Embodiments are directed to a semiconductor wafer having on-wafer circuitry. The on-wafer circuitry includes functional circuitry and first drive circuitry communicatively coupled to the functional circuitry. The on-wafer circuitry further includes test-only circuitry communicatively coupled to the functional circuitry, along with second drive circuitry communicatively coupled to the test-only circuitry. The control circuitry is communicatively coupled to the second drive circuitry and the test-only circuitry, wherein the first drive circuitry is configured to drive the functional circuitry in a first manner, and wherein the control circuitry is configured to control the second drive circuitry to drive the test-only circuitry in a second manner that is independent of the first manner.

16 Claims, 4 Drawing Sheets

(51) Int. Cl.
*G01R 31/3177* (2006.01)
*G01R 31/3193* (2006.01)
*G11C 29/14* (2006.01)
*G11C 29/08* (2006.01)
*G01R 31/319* (2006.01)
*G11C 29/12* (2006.01)
*G01R 31/3187* (2006.01)
*G01R 31/3181* (2006.01)

(52) U.S. Cl.
CPC .... *G01R 31/31937* (2013.01); *G01R 31/2815* (2013.01); *G01R 31/2817* (2013.01); *G01R 31/317* (2013.01); *G01R 31/319* (2013.01); *G01R 31/3181* (2013.01); *G01R 31/3187* (2013.01); *G01R 31/3193* (2013.01); *G01R 31/31813* (2013.01); *G01R 31/31903* (2013.01); *G01R 31/31905* (2013.01); *G01R 31/31915* (2013.01); *G11C 29/08* (2013.01); *G11C 29/12* (2013.01); *G11C 29/12005* (2013.01); *G11C 29/14* (2013.01); *G11C 2029/1206* (2013.01)

(58) Field of Classification Search
CPC ............ G01R 31/3177; G01R 31/3181; G01R 31/31813; G01R 31/318511; G01R 31/3187; G01R 31/319; G01R 31/31903; G01R 31/31905; G01R 31/31915; G01R 31/3193; G11C 29/08; G11C 29/12; G11C 29/12005; G11C 29/14; G11C 2029/08; G11C 2029/12; G11C 2029/1206

See application file for complete search history.

(56) References Cited

U.S. PATENT DOCUMENTS

| | | |
|---|---|---|
| 2005/0099202 A1 | 5/2005 | Houston et al. |
| 2008/0065934 A1* | 3/2008 | Whetsel ........... G01R 31/31919 714/701 |
| 2008/0181036 A1 | 7/2008 | Akiyama |
| 2009/0302929 A1 | 12/2009 | Chuang et al. |
| 2011/0050253 A1 | 3/2011 | Garros et al. |
| 2011/0133776 A1 | 6/2011 | Mazure et al. |
| 2015/0222268 A1 | 8/2015 | Eversmann et al. |
| 2016/0274180 A1* | 9/2016 | Hours ................ G01R 31/2817 |

\* cited by examiner

INDEPENDENTLY DRIVING BUILT-IN SELF TEST CIRCUITRY OVER A RANGE OF OPERATING CONDITIONS

BACKGROUND

The present invention relates in general to the use of on-chip test-only circuitry to test the functional circuitry of an integrated circuit (IC). More specifically, the present invention relates to operating methodologies, fabrication methodologies, and resulting structures that determine proper operation of on-chip test-only circuitry across a wide range of test conditions, do not limit the speed at which the functional circuitry operates, and minimize current draw of the test-only circuitry during normal operation of the functional circuitry.

It is known to test the functional circuitry of ICs during fabrication. A known method of testing an IC in-use is to provide on-chip test circuitry known generally as built-in self-test (BIST) circuitry or engines. In a basic configuration, a BIST circuit/engine applies an input test pattern to a circuit-under-test (CUT), and then compares the CUT output response to known-good circuit output responses. If the CUT output response is within an acceptable range of known-good circuit output responses, the BIST circuit indicates that the CUT passed, and the CUT is determined to be fault-free. If the CUT output response is outside an acceptable range of known-good circuit output responses, the BIST circuit indicates that the CUT failed, and the CUT is determined to be faulty.

SUMMARY

Embodiments are directed to a semiconductor wafer having on-wafer circuitry. The on-wafer circuitry includes functional circuitry and first drive circuitry communicatively coupled to the functional circuitry. The on-wafer circuitry further includes test-only circuitry communicatively coupled to the functional circuitry, along with second drive circuitry communicatively coupled to the test-only circuitry. The control circuitry is communicatively coupled to the second drive circuitry and the test-only circuitry, wherein the first drive circuitry is configured to drive the functional circuitry in a first manner, and wherein the control circuitry is configured to control the second drive circuitry to drive the test-only circuitry in a second manner that is independent of the first manner.

Embodiments are further directed to a semiconductor wafer having on-wafer circuitry. The on-wafer circuitry includes functional circuitry and first drive circuitry communicatively coupled to the functional circuitry. The on-wafer circuitry further includes BIST circuitry communicatively coupled to the functional circuitry, wherein the BIST circuitry includes fully depleted silicon-on-insulator (FD-SOI) transistor components having tunable threshold voltage characteristics. The on-wafer circuitry further includes bias generator circuitry communicatively coupled to the BIST circuitry. The control circuitry is communicatively coupled to the bias generator circuitry and the BIST circuitry, wherein the first drive circuitry is configured to drive the functional circuitry in a first manner, and wherein the control circuitry is configured to control the bias generator circuitry to drive the FDSOI transistor components of the BIST circuitry in a second manner that is independent of the first manner.

Embodiments are further directed to a method of operating on-wafer control circuitry of a semiconductor wafer. The method includes driving, using first on-wafer drive circuitry, on-wafer functional circuitry in a first manner. The method further includes controlling, using on-wafer control circuitry, second on-wafer drive circuitry to drive on-wafer test-only circuitry in a second manner, wherein the first manner is independent of the second manner.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

Figure 1:
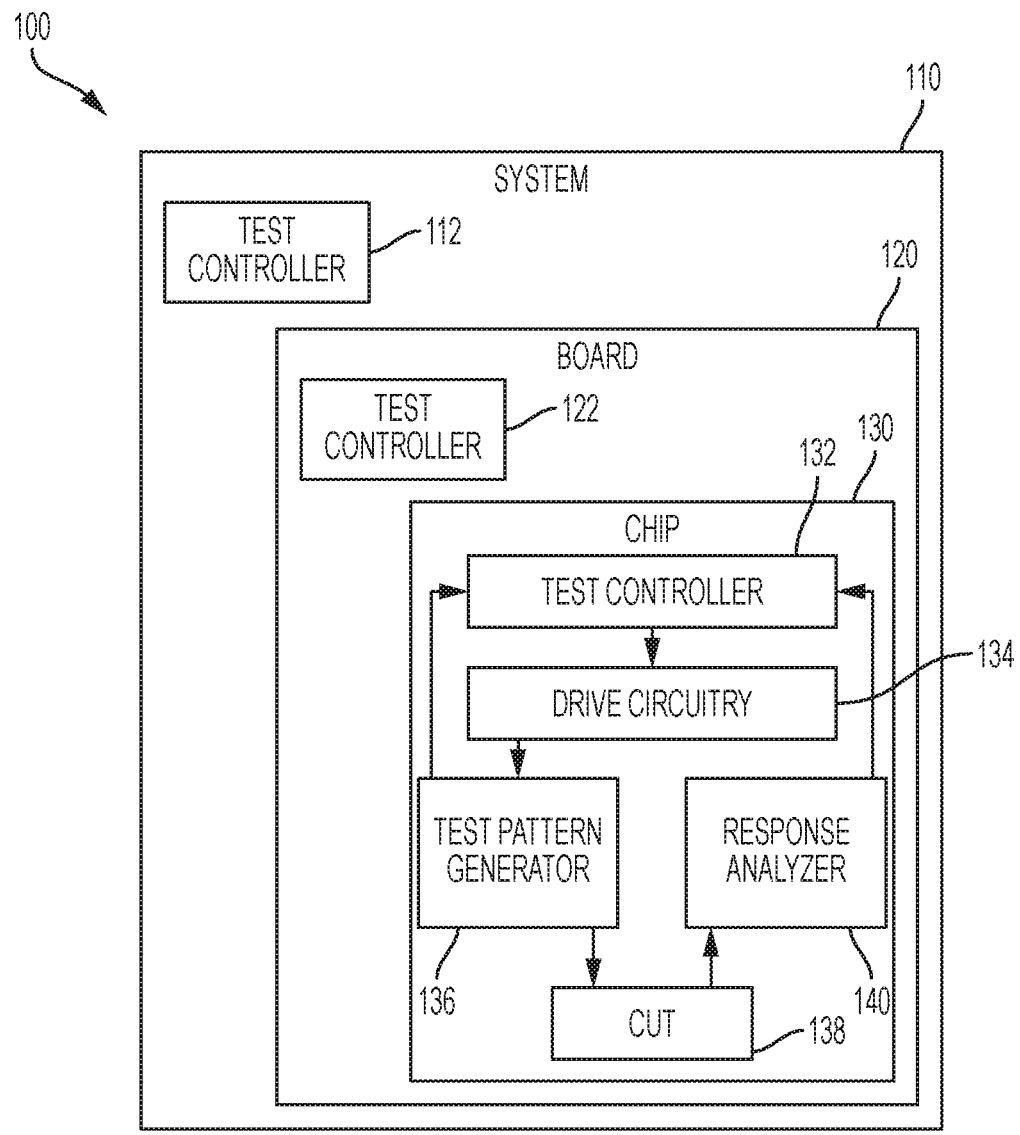
FIG. 1 depicts a block diagram of an on-chip test-only circuitry hierarchy according to one or more embodiments of the present invention.

In the accompanying figures and following detailed description of the described embodiments, the various elements illustrated in the figures are provided with three or four digit reference numbers.

DETAILED DESCRIPTION

Various embodiments of the present invention will now be described with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

The term "exemplary" and variations thereof is used herein to mean "serving as an example, instance or illustration." Any embodiment or design described herein as "exemplary" is not necessarily to be construed as preferred or advantageous over other embodiments or designs. The phrases "at least one" and "one or more" are understood to include any integer number greater than or equal to one, i.e. one, two, three, four, etc. The phrase "a plurality" is understood to include any integer number greater than or equal to two, i.e. two, three, four, five, etc. The term "connection" can include both an indirect "connection" and a direct "connection."

The phrase "functional circuitry" and variations thereof is used herein to describe the active and passive discrete components such as transistors, diodes, resistors, and capacitors that are interconnected in a predetermined pattern to perform desired functions of an IC.

The phrases "on-chip test-only circuitry," "on-wafer test-only circuitry," "built-in self-test circuitry," and variations thereof are used herein to describe circuitry that is provided on a chip for the purpose of testing the functional circuitry of the IC. On-chip test-only circuitry can be implemented in a variety of ways.

The phrase "normal operation" and variations thereof is used herein to describe functional circuitry operations of an IC that perform the regular functions of the functional circuitry and do not perform test-specific operations.

The phrases "test-specific operation," "test operations," "active test operations" and variations thereof are used herein to describe functional circuitry operations of an IC that are performed in response to inputs or other excitations initiated by on-chip test-only circuitry.

The phrase "in-operation test" and variations thereof is used herein to describe testing the functional circuitry of an IC during post-fabrication operation of the IC. In-operation testing can be performed by on-chip test-only circuitry applying or initiating the application of test inputs (e.g., a test pattern of input signals) to the functional circuitry.

The phrase "fabrication test" and variations thereof is used herein to describe testing the functional circuitry of an IC and/or the on-chip test-only circuitry of an IC as part of the overall fabrication processes of the same.

The terms "robust," "robustness" and variations thereof are used herein to describe one or more of several capabilities of a circuit, system or method, including but not limited to the capability to recover from or hold up under exceptional operating circumstances.

The terms "about," "substantially," "approximately" and variations thereof are intended to include the degree of error associated with measurement of the particular quantity based upon the equipment available at the time of filing the application. For example, "about" can include a range of ±8% or 5%, or 2% of a given value.

Semiconductor devices are used in a variety of electronic and electro-optical applications. ICs are typically formed from various circuit configurations of discrete components (e.g., transistors, capacitors, resistors, semiconductor devices, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the combination of operations and/or resulting structures of the present invention described herein are unique. Thus, the unique combination of the operations described in connection with the present invention utilize a variety of individually known physical and chemical processes performed on a semiconductor (e.g., silicon) substrate, some of which are described in the following paragraphs.

The semiconductor device structures of the present invention can be fabricated in a number of ways using a number of different tools. In general, though, the methodologies and tools are used to form structures with dimensions in the micrometer and nanometer scale. The methodologies, i.e., technologies, employed to fabricate the semiconductor device structures of the present invention have been adopted from IC technology. For example, semiconductor device structures are built on wafers and are realized in films of material patterned by photolithographic processes on the top of a wafer. In particular, the fabrication of semiconductor device structures uses four basic building blocks: (i) deposition of thin films of material on a substrate, (ii) applying a patterned mask on top of the films by photolithographic imaging, (iii) semiconductor doping, and/or (iv) etching the films selectively to the mask.

Turning now to an overview of technologies that are more specifically relevant to an understanding of the present invention, as previously noted herein, it is known to test the functional circuitry of ICs during fabrication. A known method of testing an IC in-use is to provide on-chip test circuitry known generally as BIST circuitry or engines. In a basic configuration, a BIST circuit/engine applies an input test pattern to a CUT, and then compares the CUT output response to known-good circuit output responses. If the CUT output response is within an acceptable range of known-good circuit output responses, the BIST circuit indicates that the CUT passed, and the CUT is determined to be fault-free. If the CUT output response is outside an acceptable range of known-good circuit output responses, the BIST circuit indicates that the CUT failed, and the CUT is determined to be faulty. In some IC designs, the BIST circuitry, in response to determining that a CUT has failed, triggers an on-chip replacement process that adjusts chip connections such that on-chip redundant circuitry, in effect, replaces the failed CUT.

In addition to testing the performance of the functional circuitry (i.e., the CUT) of an IC during IC fabrication, it is also necessary during IC fabrication to test the on-chip BIST circuitry. Accordingly, BIST engines and other on-chip test circuitry are executed at the end of the chip fabrication phase and potentially during the IC lifetime to ascertain the functionality of the IC. For accurate sorting, classification, and redundancy substitution, the BIST engine and other test-only circuitry must operate properly across an extreme range of test conditions. Additionally, in order for the functional circuitry of the IC to be tested correctly, the BIST engine and other test-only circuitry must not operate in a manner that limits the speed at which the functional circuits of the IC can operate. Additionally, the duration of actual BIST testing can be extremely brief in comparison to the IC's operating lifetime. For example, in some implementations, after a BIST test is complete it is possible that the BIST circuitry is never be used again.

Turning now to an overview of the present invention, one or more embodiments provide operating methodologies, fabrication methodologies, and resulting structures that determine proper operation of on-chip test-only circuitry across a wide range of test conditions, do not limit the speed at which the functional circuitry (i.e., the CUT) operates, and minimize current draw of the test-only circuitry during normal operation of the functional circuitry. According to one or more embodiments, during fabrication testing of the test-only circuitry and functional circuitry, the test-only circuitry of the IC is driven separately from the functional circuitry of the IC. According to one or more embodiments, the test-only circuitry of the IC is driven separately from the functional circuitry of the IC by on-chip bias generators, and test control circuitry is provided to control the on-chip bias generators. The on-chip bias generators drive the bias voltages of the transistor-based test-only circuitry, and the text control circuitry modulates the bias generators based on signals input from the test-only circuitry.

In one or more embodiments, the test-only circuitry is implemented using FDSOI transistors having back-gate biasing capability, and the on-chip bias generators drive the back-gate bias of the test-only circuit FDSOI transistors. By utilizing the back-gate bias capability in FDSOI technology, the threshold voltages in the test-only circuitry can be modulated independently of the functional circuitry. For example, while testing the functional circuit for low-voltage operation, the threshold voltages in the test-only circuitry can be reduced to very low values to maintain functionality. Similarly, the threshold voltages in the test-only circuitry can be increased during high voltage testing of the functional circuit to avoid race conditions. The modulation of the test-only circuitry is determined by the test control circuitry, which tracks the functional circuitry environmental conditions and adjusts the back-gate biases to match what is appropriate for the functional circuitry environmental conditions. Thus, by utilizing the novel circuit configurations described herein, the back-gate biases of the test-only circuitry are generated on-chip. In one or more embodiments, the modulation is applied only during active testing mode. In one or more embodiments, the leakage power drawn by the test-only circuitry is minimized by raising the test-only circuit's threshold voltages when the test-only circuitry is not in use. In one or more embodiments, the leakage power drawn by the test-only circuitry is minimized by disabling the bias generators when the test-only circuitry is not in use.

Accordingly, on-chip test-only circuit configurations according to embodiments of the present invention improve robustness of the BIST engine in that the BIST engine and other test only circuitry operate properly across the extreme range of test conditions, and operate so that the test circuitry does not limit the speed at which the circuits can operate, thus ensuring that the functional chip is tested correctly.

Turning now to a more detailed description of the present invention, FIG. 1 depicts a block diagram of an on-chip test-only circuitry hierarchy 100 according to one or more embodiments. The on-chip test-only circuitry hierarchy 100 includes a system 110, a system test controller 112, a board 120, a board test controller 122, a chip 130, a chip test controller 132, drive circuitry 134, a test pattern generator 136, a CUT 138 (i.e., the portion of the functional chip circuitry that is under test), and a response analyzer 140, configured and arranged as shown.

The on-chip test-only hierarchy 100 automatically tests the system 110, the board 120 and the chip 130 by applying certain test stimulus and observing the corresponding system/board/chip response. Because the test framework is embedded directly into the system 110, the board 120 and the chip 130, the testing process has the potential of being faster and more economical than using an external test setup. The system test controller 112 can simultaneously activate self-tests on all boards 120. In turn, the board test controller 122 can activate the chip test controller 132 to activate self-tests on one or more chips 130 of each board 120.

The on-chip test-only hierarchy 100 can support various testing procedures that can be implemented during the design and manufacture of system 110. In general, the testing procedures of system 100 can be grouped into three main phases, namely design verification, testing for manufacturing defects, and system operation. In design verification, the design is tested to determine whether it satisfies the system specification. Design verification testing typically includes simulating the design under test with respect to logic, switching levels and timing. Testing for manufacturing defects includes wafer level testing and device level testing. In the former, a chip on a wafer is tested and if passed, is packaged to form a device. Device level testing includes so-called "burn-in testing," which tests the CUT under extreme ratings (i.e., high end values) of temperature, voltage and other operational parameters such as speed. In system operation testing, the system can be implemented using a chip-set where each chip takes on a specific system function. Once a system has been completely fabricated at the board level, it still needs to be tested for any printed circuit board (PCB) faults that might affect operation. For this purpose, concurrent fault detection circuits (CFDCs), which make use of error correction codes such as parity or cyclic redundancy check (CRC), can be used, for example by test pattern generator 136, to determine if and when a fault occurs during the operation of system 110. After system 110 is functional and operating in the field, the on-chip test-only circuitry hierarchy 100 tests the design for functional integrity without requiring direct test access.

The overall function of chip test controller 132 is to orchestrate the transactions that are necessary to perform self-test. In large or distributed systems, chip test controller 132 can also communicate with other test controllers (e.g., system test controller 110, board test controller 120) to verify the integrity of the system as a whole. Drive circuitry 134 is controlled by the chip test controller 134 to provide the bias voltages that drive certain transistors (e.g., FDSOI transistors 200 shown in FIG. 2) of the test pattern generator 136. According to embodiments of the present invention, the chip test controller 132 and drive circuitry 134 are configured to drive these transistors of the test pattern generator 136 in a manner that is different than other drive circuitry (not shown in FIG. 1) on the chip 130 drives the function circuitry (e.g., the CUT 138) of the chip 130. More specifically, chip test controller 132 and drive circuitry 134 modulate the bias voltages applied to these transistors of the test pattern generator 136 based at least in part on feedback signals received from the test pattern generator circuit 136.

Additional details of how the chip test controller 132 controls the drive circuitry 134 to drive certain transistors of the test pattern generator 136 are described later in this description in connection with the descriptions of FIGS. 2, 3 and 4.

Depending upon the desired fault coverage and the specific faults to be tested, the test pattern generator 136 generates a sequence of test vectors for the CUT 138, and, under control of the chip test controller 132 and the drive circuitry 134, applies the test vectors to the CUT 138 in the correct sequence. A read only memory (not shown) with stored deterministic test patterns, counters, linear feedback shift registers, and the like, are some examples of the types of hardware components that can be used to construct the test pattern generator 136.

The chip test controller 132 initiates the self-test sequence. The chip test controller 132 places the CUT 138 in test mode, which allows the chip test controller 132, drive circuitry 134 and test pattern generator 136 to drive inputs of the CUT 138 directly. During the test sequence, the chip test controller 132 interacts with the output response analyzer 140 to ensure that the proper signals are being compared. The response analyzer 140 compares the output response of the CUT 38 to known-good circuit output responses. If the output response of the CUT 138 is within an acceptable range of known-good circuit output responses, the response analyzer 140 indicates that the CUT 138 passed, and the CUT 138 is determined to be fault-free. If the output response of the CUT 138 is outside an acceptable range of known-good circuit output responses, the response analyzer 140 indicates that the CUT 138 failed, and the CUT 138 is determined to be faulty.

As previously noted herein, the chip test controller 132 and the drive circuitry 134 modulate the bias voltages applied to certain transistors of the test pattern generator 136 based at least in part on feedback signals received from the test pattern generator circuit 136. According to one or more embodiments of the present invention, at least some of the transistors that the form the test pattern generator 136 are FDSOI transistors, and the modulation of the bias voltages of these FDSOI transistors utilize a FDSOI biasing technique known as back-gate biasing. An example FDSOI transistor 200 is shown in FIG. 2 and described in more detail later in this detailed description.

Turning now to a general description of FDSOI technology, in a conventional bulk silicon planar transistor, two electrical terminals, namely the source and the drain, are built in the bulk silicon substrate. Dopants are often added to the substrate to improve the conductive properties of the silicon. The gate controls the flow of electrons between the source and the drain. When voltage is applied to the gate, a conductive channel is formed between the source and the drain, electric current flows from the source through the channel to the drain, and the transistor is in an "on" state. When voltage is removed from the gate, the flow of electrons from the source through the channel to the drain is turned off, and the transistor is in and "off" state. The transistor thus acts as a switch.

Continuing with conventional bulk silicon planar transistors, as the size of the transistor is reduced, the length dimension of the gate is also reduced, which in turn lowers the transistor's performance by reducing the control the gate exercises over the channel region. Reducing the size of a conventional bulk silicon transistor also increases the amount of unwanted leakage current that flows through the bulk silicon substrate even when the transistor is switched off, and increased leakage current increases the transistor's power consumption. In order to minimize leakage currents while continuing to deliver high performance, bulk silicon transistors have become more complex, this adding fabrication complexity at an increasing rate.

In contrast to conventional bulk silicon transistors, FDSOI is a semiconductor fabrication technology that provides the benefits of reduced silicon geometries while enabling a simplification of the fabrication process. Unlike many approaches to reducing a transistor's footprint, FDSOI does not change the fundamental geometry of the MOSFET (metal oxide semiconductor field effect transistor). In FDSOI technology, a distinguishing feature is the addition of a thin layer of insulator called the buried oxide (BOX) layer, which is positioned just below an ultra thin body/layer of silicon that forms the channel. This FDSOI channel configuration is often referred to as ultra thin body and BOX (UTBB). The BOX layer eliminates the need to add dopants to the channel, thus making the channel "fully depleted." The result is that the gate of an FDSOI transistor very tightly controls the full volume of the transistor body. A feature of FDSOI transistors that is utilized by embodiments of the present invention is the ability to implant a back-gate contact in the silicon substrate, wherein the BOX layer and the back-gate contact form, in effect, a transistor back-gate that can be biased in order to shift the FDSOI transistor's threshold voltage $V_T$.

Figure 2:
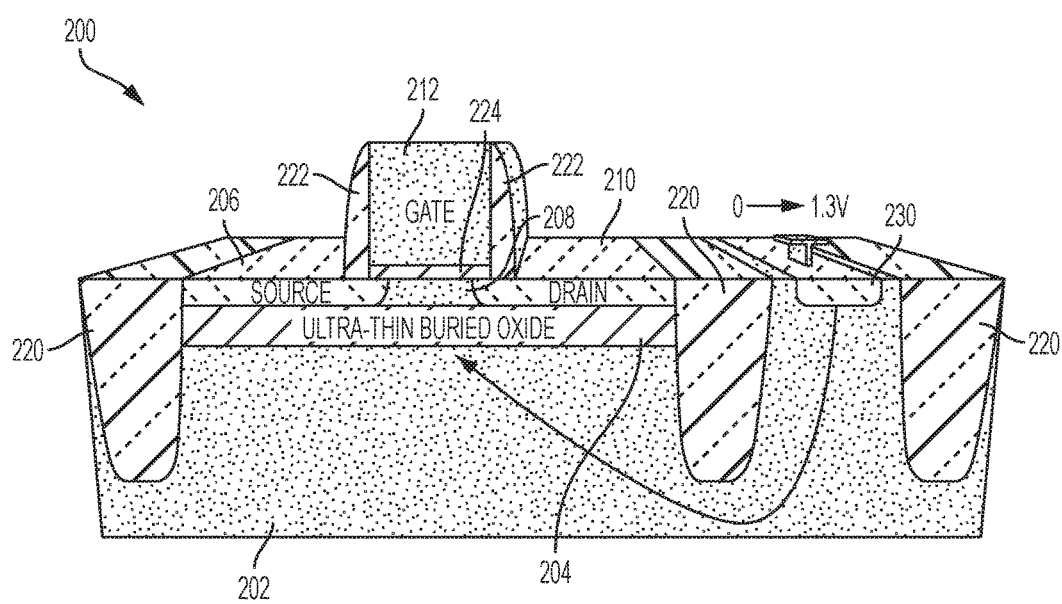
FIG. 2 depicts a FDSOI transistor capable of being utilized in connection with one or more embodiments of the present invention.

FIG. 2 depicts an example configuration of a FDSOI transistor 200, which can have its back-gate bias modulated by the chip test controller 132 (shown in FIG. 1) and the drive circuitry 134 (shown in FIG. 1) based at least in part on feedback signals received from the test pattern generator circuit 136 (shown in FIG. 1) in accordance with embodiments of the present invention. FDSOI transistor 200 includes a bulk silicon substrate 202, an ultra-thin buried oxide (BOX) layer 204, a source region 206, a channel region 208, a drain region, 210, and a gate region 212, configured and arranged as shown. Shallow trench isolation (STI) regions 220 electrically and physically isolate the FDSOI transistor 200. Gate sidewalls 222 and a bottom gate oxide 224 surround the gate region 212. In one or more embodiments, a back-gate 230 is provided for back-gate biasing the FDSOI transistor 200. In one or more embodiments, the channel region 208 has a so-called ultra-thin thickness in the vertical direction from about 10 nm to about 30 nm. In one or more embodiments, BOX layer 204 has a so-called standard thickness in the vertical direction (i.e., a direction perpendicular to a front face of the substrate 202) of about 145 nanometers (nm). In one or more embodiments, BOX layer 204 has a so-called ultra-thin thickness in the vertical direction from about 10 nm to about 30 nm.

Embodiments of the present invention form at least a portion of test pattern generator 136 (shown in FIG. 1) from FDSOI transistor 200, and back-gate bias FDSOI transistor 200 through back-gate 230 in order to shift the threshold voltage, $V_T$, of FDSOI transistor 200. Back-biasing changes the electrostatic control of FDSOI transistor 200 and allows its $V_T$ to be tuned in a manner that provides either more drive current and higher performance at the expense of increased leakage current (i.e., forward back-bias (FBB)), or that cuts leakage current at the expense of reduced performance. Accordingly, back-biasing provides an efficient mechanism for making desired trade-offs between speed and power in FDSOI transistor 200. According to embodiments of the present invention, the chip test controller 132 (shown in FIG. 1) and the drive circuitry 134 (shown in FIG. 1) control the bias on the back-gate 230 in order to dynamically modulate $V_T$ of the FDSOI transistor 200 the FDSOI transistor's operation. This approach, according to embodiments of the present invention, allows the FDSO transistor 200, and hence at least some portions of the test pattern generator 136, to be faster when required by certain test conditions, and to be more energy efficient under test conditions for which performance is less important. Accordingly, embodiments of the present invention utilize the chip test controller 132 and the drive circuitry 134 to drive certain transistors (e.g., FDSOI transistor 200) of the test pattern generator 136 in a manner that is different than other drive circuitry (not shown) on the chip 130 drives the function circuitry of the chip 130.

As an alternative to utilizing the back-gate biasing features of FDSOI transistors, embodiments of the present invention can also utilize the body biasing features of planar bulk silicon transistor technology (e.g., a MOSFET). In general, body biasing is a technique where the substrate/wells on the wafer are biased to something other than ground (GND) or Vdd. If body biasing is used to implement embodiments of the present invention, it should be noted that bulk technology body biasing can lose efficiency at reduced transistor geometries.

Figure 3:
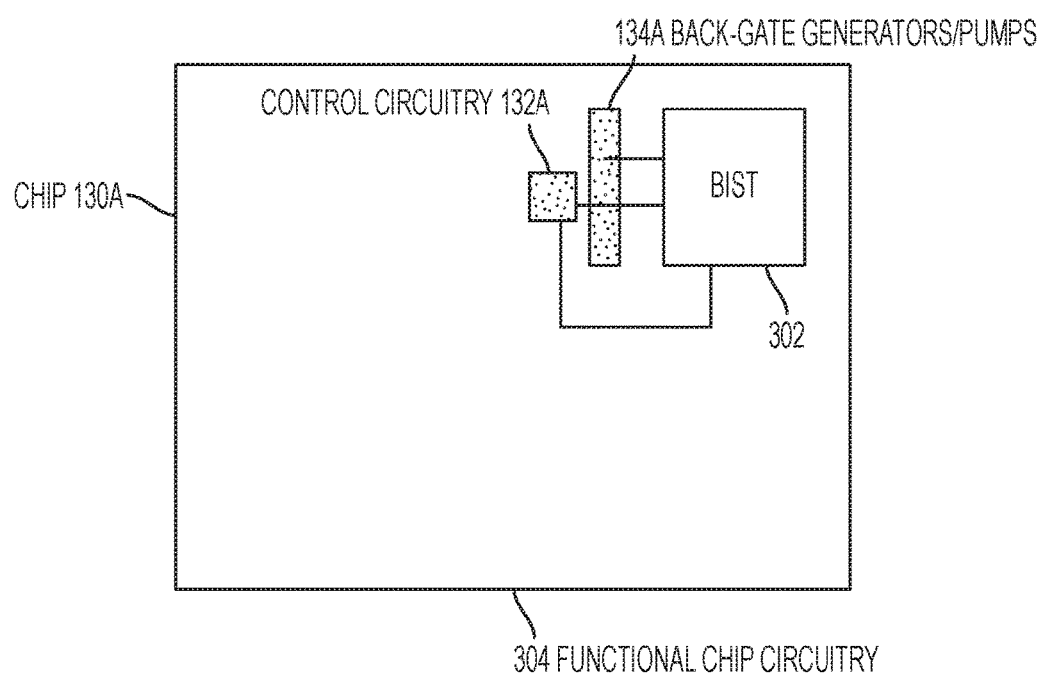
FIG. 3 depicts a block diagram of an on-chip test-only circuit configuration according to one or more embodiments of the present invention.

FIG. 3 depicts a block diagram of a chip 130A having an on-chip test-only circuit configuration according to one or more embodiments of the present invention. The chip 130A is similar to the chip 130 depicted in FIG. 1, except the drive circuit 134 is implemented as back-gate bias generators/pumps 134A, and the test pattern generator 134 and response analyzer 140 are implemented as a BIST engine/circuit 302. The chip test controller 132 corresponds to the chip test control circuitry 132A. The CUT 138 corresponds to functional chip circuitry 304, which includes the circuitry and active and passive discrete components (e.g., drive circuitry, transistors, diodes, resistors, and capacitors) that are interconnected in a predetermined pattern to perform desired functions of the chip 130A. In one or more embodiments, FDSOI transistors 200 (shown in FIG. 2) are used to form at least a portion of the BIST engine/circuit 302. The FDSOI transistors 200 of the BIST engine/circuit 302 are, according to embodiments of the present invention, provided as distinct and independent circuitry from the rest of the BIST engine/circuit 302. Back-gate bias generators 134A can be implemented as so-called back-gate pumps. Chip test control circuit 132A can be implemented as any logic based control circuitry, including for example a processor.

The BIST engine/circuit 302 can take a variety of forms. In a basic configuration, BIST engine 302 applies an input test pattern to the CUT (i.e., functional circuitry 304), and then compares the CUT output response to known-good circuit output responses. If the CUT output response is within an acceptable range of known-good circuit output responses, BIST engine 302 indicates that the CUT passed, and the CUT is determined to be fault-free. If the CUT output response is outside an acceptable range of known-good circuit output responses, BIST engine 302 indicates that the CUT failed, and the CUT is determined to be faulty.

Figure 4:
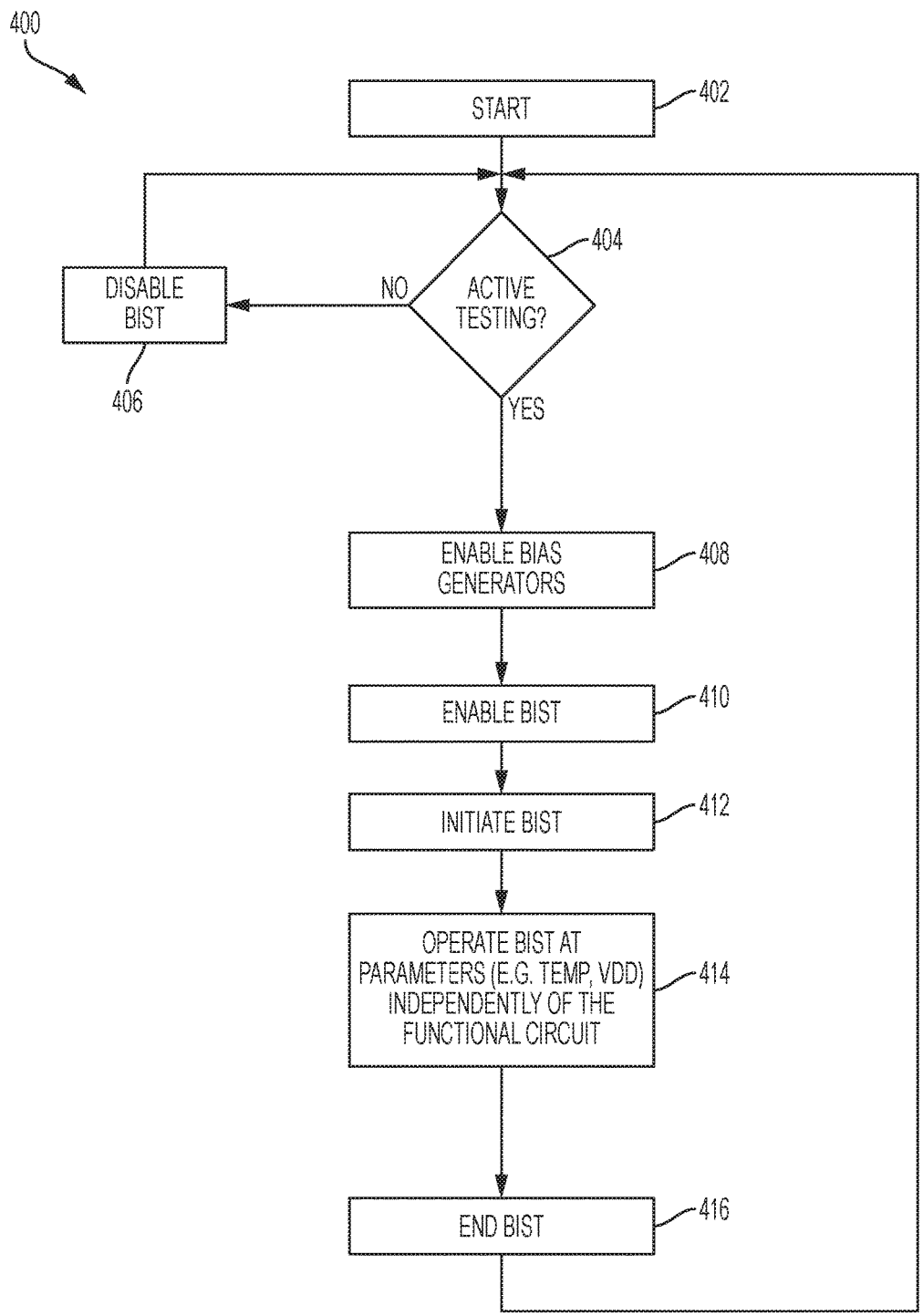
FIG. 4 depicts a flow diagram illustrating a methodology according to one or more embodiments of the present invention.

FIG. 4 depicts a flow diagram illustrating a methodology 400 according to one or more embodiments of the present invention. Specifically, methodology 400 can be implemented using either the on-chip test-only circuitry hierarchy 100, the chip 130 and its associated circuitry (chip test controller 132, drive circuitry 134, test pattern generator 136, response analyzer 140), or the chip 130A and its associated circuitry (chip test control circuitry 132A, back-gate bias generators/pumps 134A, BIST engine/circuit 302).

The operation of the chip test control circuitry 132A, back-gate bias generators/pumps 134A, and BIST engine/circuit 302 will now be described with reference to components shown in FIG. 2 or 3 and methodology 400 shown in FIG. 4. It should be noted that the operations of methodology 400, which are described herein as being performed by the chip 130A, chip test control circuitry 132A, back-gate bias generators/pumps 134A, and BIST engine/circuit 302, can also be performed by the chip 130 and its associated on-chip circuitry (chip test controller 132, drive circuitry 134, test pattern generator 136, response analyzer 140).

During normal chip operation, the BIST engine/circuit 302 is disabled, which can be accomplished by, for example, disabling or turning off the back-gate bias generators/pumps 134A, or arranging the threshold voltages, $V_T$, in the BIST engine/circuit 302 to be high (low leakage) when the pumps are not operating, or gating off the power bus (not shown) to the BIST engine/circuit 302 (Blocks 404, 406). In the latter case, however, the power gating device must be sufficiently large to not degrade the BIST engine/circuit 302 when active. Additionally, any assist-like pumped supplies (not shown) would also be disabled.

During active test mode, the back-gate bias generators/pumps 134A are enabled, and the chip test control circuitry 132A and back-gate bias generators/pumps 134A adjust the back-gate biases of the FDSOI transistors 200 (shown in FIG. 2) of the BIST engine/circuit 302 to maintain BIST operation despite Vdd and/or temperature extremes (Blocks 404, 408, 410, 412, 414, 416). Similarly, a write-assist-like pumped power supply (ground or Vdd) can be employed in the BIST engine/circuitry 302 during test operation.

By utilizing the back-gate capability of FDSOI transistors that form a portion of the BIST engine/circuit 302, the threshold voltages $V_T$ of the FDSOI transistors in the BIST engine/circuit 302 can be modulated independently of the functional chip circuitry 304. For example, while testing for low-voltage operation, the threshold voltages in the FDSOI transistors of the BIST engine/circuit 302 can be reduced to a very low value to maintain functionality. Similarly, the threshold voltages in the FDSOI transistors of the BIST engine/circuit 302 can be increased during high voltage testing to avoid race conditions. In one or more embodiments of the present invention, the modulation is determined at least in part by the chip test control circuitry 132A tracking the environmental conditions of the functional chip circuitry 304 and adjusting the back-gate biases of the FDSOI transistors of the BIST engine/circuit 302 accordingly. As an example of using feedback to control modulation performed by the chip test control circuitry 130A, the BIST designer establishes some measure of functional circuit behavior that will maintain functionality, such as a DC current level or a ring delay. The appropriate structure is embedded within the BIST engine/circuit 302, using the same Vdd and back-gates as the BIST engine/circuit 302. This measurement is passed from the BIST engine/circuit 302 to the test control circuitry 130A, which then drives the back-gate bias generators/pumps 134A to increase or decrease the threshold voltage $V_T$ of the FDSOI transistors of the BIST engine/circuit 302 until the metric achieves an acceptable level.

Thus it can be seen from the foregoing detailed description and accompanying illustrations that embodiments of the present invention provide technical benefits and effects. By utilizing the back-gate capability in FDSOI technology, the threshold voltages in the BIST engine can be modulated independently of the functional unit. For example, while testing for low-voltage operation, the threshold voltages in the BIST can be reduced to a very low value to maintain functionality. Similarly, the threshold voltages in the BIST can be increased during high voltage testing to avoid race conditions. The modulation can be determined by a test circuit that tracks the functional chip environmental conditions and adjusts the back-gate biases accordingly. The back-gate biases can be generated on-chip. The modulation can be applied only during active testing mode. The leakage power drawn by the BIST unit can be minimized when not in use by raising the threshold voltages. The back-gate bias generators can be disabled when not in use.

During normal chip operation the back-gate generators can be disabled by turning them off. The threshold voltages in the BIST can be arranged so as to be high (low leakage) when the pumps are not operating. Alternatively, the power bus to the BIST can be gated off. In the latter case, however, the power gating device must be very large so as to not degrade the BIST function when active. During active test mode the back-gate bias generators are enabled, and the control circuitry adjusts the back-gate biases to maintain BIST operation despite Vdd and/or temperature extremes.

Accordingly, on-chip test-only circuit configurations according to embodiments of the present invention improve robustness in that the BIST engine and other test only circuitry operate properly across the extreme range of test conditions, and operate so that the test circuitry does not limit the speed at which the circuits can operate, thus ensuring that the functional chip is tested correctly.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

While the present invention has been described in detail in connection with only a limited number of embodiments, it should be readily understood that the present invention is not limited to such described embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A semiconductor wafer having on-wafer circuitry comprising:
   functional circuitry comprising discrete functional components communicatively coupled to first drive circuitry;
   test-only circuitry communicatively coupled to the functional circuitry;
   second drive circuitry communicatively coupled to the test-only circuitry; and
   control circuitry communicatively coupled to the second drive circuitry and the test-only circuitry;
   wherein the first drive circuitry is configured to drive the functional circuitry in a first manner;
   wherein the control circuitry is configured to control the second drive circuitry to drive the test-only circuitry in a second manner that is independent of the first manner;
   wherein the second manner comprises disabling the second drive circuitry when the test-only circuitry is not actively performing test operations; and
   wherein the test-only circuitry is configured such that threshold bias signals of the test-only circuitry are above a predetermined level when the test-only circuitry is not performing test operations.

2. The semiconductor wafer of claim 1, wherein the second manner comprises:
   receiving, at the control circuitry, control data from the test-only circuitry;
   based at least in part on the control data, controlling, using the control circuitry, the second test-only drive circuitry to:
     generate modulated test-only drive signals; and
     apply the modulated test-only drive signals to drive the test-only circuitry.

3. The semiconductor wafer of claim 1, wherein the second manner comprises disabling the test-only circuitry when the test-only circuitry is not actively performing test operations.

4. The semiconductor wafer of claim 1, wherein the second manner comprises:
   testing the functional circuit under active testing conditions comprising:
   applying first functional circuitry drive signal levels above a first predetermined threshold level to the functional circuitry; and
   applying second functional circuitry drive signal levels below a second predetermined threshold level to the functional circuitry.

5. The semiconductor wafer of claim 4, wherein the second manner comprises:
   modulating test-only circuitry drive signals based at least in part on whether the active testing conditions comprise:
   applying the first functional circuitry drive signal levels above the first predetermined threshold; or
   applying the second functional circuitry drive signal levels below the second predetermined threshold.

6. The semiconductor wafer of claim 1, wherein the second manner comprises:
   testing the functional circuit under active testing conditions comprising:
   applying first functional circuitry drive signal levels above a first predetermined threshold to the functional circuitry;
   applying second functional circuitry drive signal levels below a second predetermined threshold level to the functional circuitry;

applying third functional circuitry drive signal levels between the first predetermined threshold and the second predetermined threshold; and modulating test-only circuitry drive signals based at least in part on whether the active testing conditions comprise:

applying the first functional circuitry drive signal levels above the first predetermined threshold to the functional circuitry;

applying second functional circuitry drive signal levels below the second predetermined threshold level to the functional circuitry; or applying third functional circuitry drive signal levels between the first predetermined threshold and the second predetermined threshold.

7. A semiconductor wafer having on-wafer circuitry comprising:

functional circuitry comprising discrete functional components communicatively coupled to first drive circuitry;

built-in self-test-only (BIST) circuitry communicatively coupled to the functional circuitry, wherein the BIST circuitry comprises fully depleted silicon-on-insulator (FDSOI) transistor components having tunable threshold voltage characteristics;

bias generator circuitry communicatively coupled to the BIST circuitry; and control circuitry communicatively coupled to the bias generator circuitry and the BIST circuitry;

wherein the first drive circuitry is configured to drive the functional circuitry in a first manner;

wherein the control circuitry is configured to control the bias generator circuitry to drive the FDSOI transistor components of the BIST circuitry in a second manner that is independent of the first manner.

8. The semiconductor wafer of claim 7, wherein the second manner comprises:

receiving, at the control circuitry, control data from the BIST circuitry; and based at least in part on the control data, controlling, using the control circuitry, the bias generator circuitry to:

generate modulated BIST drive signals; and apply the modulated BIST drive signals to back-gates of the FDSOI transistor components of the BIST circuitry to determine threshold voltages of the FDSOI transistor components.

9. The semiconductor wafer of claim 7, wherein the second manner comprises:

disabling the bias generator circuitry when the BIST circuitry is not actively performing test operations.

10. The semiconductor wafer of claim 7, wherein:

the second manner comprises:

testing the functional circuit under active testing conditions comprising:

applying first functional circuitry drive signal levels above a first predetermined threshold level to the functional circuitry; and applying second functional circuitry drive signal levels below a second predetermined threshold level to the functional circuitry; and generating modulated BIST drive signals based at least in part on whether the active testing conditions comprises:

applying the first functional circuitry drive signal levels above the first predetermined threshold; or applying the second functional circuitry drive signal levels below the second predetermined threshold.

11. A method of driving circuitry of a semiconductor wafer, the method comprising:

driving, using first on-wafer drive circuitry, on-wafer functional circuitry in a first manner; and controlling, using on-wafer control circuitry, second on-wafer drive circuitry to drive on-wafer test-only circuitry in a second manner;

wherein the first manner is independent of the second manner;

wherein the second manner comprises disabling the second on-wafer drive circuitry when the on-wafer test-only circuitry is not actively performing test operations; and wherein the on-wafer test-only circuitry is configured such that threshold bias signals of the on-wafer test-only circuitry are above a predetermined level when the on-wafer test-only circuitry is not performing test operations.

12. The method of claim 11, wherein the second manner comprises:

receiving, at the on-wafer control circuitry, control data from the on-wafer test-only circuitry; and modulating test-only circuitry drive signals based at least in part on the control data.

13. The method of claim 11, wherein the second manner comprises disabling the on-wafer test-only circuitry when the on-wafer test-only circuitry is not actively performing test operations.

14. The method of claim 11, wherein the second manner comprises:

testing the on-wafer functional circuit under active testing conditions comprising:

applying first functional circuitry drive signal levels above a first predetermined threshold level to the on-wafer functional circuitry; and applying second functional circuitry drive signal levels below a second predetermined threshold level to the on-wafer functional circuitry.

15. The method of claim 14, wherein the second manner comprises:

modulating test-only circuitry drive signals based at least in part on whether the active testing conditions comprise:

applying the first functional circuitry drive signal levels above the first predetermined threshold; or applying the second functional circuitry drive signal levels below the second predetermined threshold.

16. The method of claim 11, wherein the second manner comprises:

testing the on-wafer functional circuit under active testing conditions comprising:

applying first functional circuitry drive signal levels above a first predetermined threshold to the on-wafer functional circuitry;

applying second functional circuitry drive signal levels below a second predetermined threshold level to the on-wafer functional circuitry;

applying third functional circuitry drive signal levels between the first predetermined threshold and the second predetermined threshold; and modulating test-only circuitry drive signals based at least in part on whether the active testing conditions comprise:

applying the first functional circuitry drive signal levels above the first predetermined threshold to the on-wafer functional circuitry;

applying second functional circuitry drive signal levels below the second predetermined threshold level to the on-wafer functional circuitry; or applying third functional circuitry drive signal levels between the first predetermined threshold and the second predetermined threshold.

\* \* \* \* \*